US007279831B2

(12) United States Patent
McDonough et al.

(10) Patent No.: US 7,279,831 B2
(45) Date of Patent: Oct. 9, 2007

(54) HYDRO-INSENSITIVE ELECTROLUMINESCENT DEVICES AND METHODS OF MANUFACTURE THEREOF

(75) Inventors: Neil McDonough, Paxton, MA (US); Daniel P. Segall, Longmeadow, MA (US); Iris E. Hilton, Charlton, MA (US); John R. Pennace, Paxton, MA (US)

(73) Assignee: FLEXcon Company, Inc., Spencer, MA (US)

( * ) Notice: Subject to any disclaimer, the term of this patent is extended or adjusted under 35 U.S.C. 154(b) by 89 days.

(21) Appl. No.: 10/410,920

(22) Filed: Apr. 10, 2003

(65) Prior Publication Data

US 2003/0222573 A1 Dec. 4, 2003

Related U.S. Application Data

(60) Provisional application No. 60/371,375, filed on Apr. 10, 2002, provisional application No. 60/404,420, filed on Aug. 19, 2002.

(51) Int. Cl.
*H05B 33/00* (2006.01)
*H05B 33/04* (2006.01)
*H01L 51/50* (2006.01)

(52) U.S. Cl. ...................... 313/502; 313/503; 313/512; 428/917

(58) Field of Classification Search ........ 313/498–512; 428/690, 917, 428
See application file for complete search history.

(56) References Cited

U.S. PATENT DOCUMENTS 4,188,449 A 2/1980 Lu et al.
4,417,174 A * 11/1983 Kamijo et al. .............. 313/503
4,687,968 A 8/1987 Frayer
5,321,069 A 6/1994 Owens
5,409,777 A 4/1995 Kennedy et al.
5,906,720 A 5/1999 Ferguson et al.
6,198,216 B1 * 3/2001 Kosa et al. ................. 313/503
6,207,077 B1 3/2001 Burnell-Jones
6,432,516 B1 8/2002 Terasaki et al.
2001/0038925 A1 * 11/2001 Barton et al. ............... 313/503

FOREIGN PATENT DOCUMENTS

| | | |
|---|---|---|
| JP | 2257590 A | 6/1990 |
| JP | 7011247 | 1/1995 |
| JP | 2000260561 | 9/2000 |
| WO | WO 00/29493 | 5/2000 |
| WO | WO 01/74119 | 10/2001 |
| WO | WO 02/19020 | 3/2002 |

* cited by examiner

*Primary Examiner*—Mariceli Santiago
(74) *Attorney, Agent, or Firm*—Gauthier & Connors, LLP

(57) ABSTRACT

A water vapor permeable composite is disclosed for use in electroluminescent devices. The composite includes polymeric material having a first surface energy, a phosphorescent material dispersed within at least a portion of said polymeric material; and an electrically conductive material on at least one side of said polymeric material. The conductive material has a second surface energy, said the first and second surface energies are each between about 32 dynes/cm and 46 about dynes/cm. The polymeric material has a moisture vapor transmission rate of at least one gram/100 sq. inches for a 24 hour period at 100° F. for a one mil thick barrier.

19 Claims, 3 Drawing Sheets

HYDRO-INSENSITIVE ELECTROLUMINESCENT DEVICES AND METHODS OF MANUFACTURE THEREOF

PRIORITY INFORMATION

The present application claims priority to U.S. Provisional Patent Applications Ser. Nos. 60/371,375 filed Apr. 10, 2002, and 60/404,420 filed Aug. 19, 2002.

BACKGROUND OF THE INVENTION

The invention relates to luminescent materials and relates in particular to electro-luminescent devices that include luminescent materials.

Electroluminescent materials generally include phosphorescent particles that are suspended within or coated by a polymeric material. Electroluminescent devices typically provide an electric field in the area of the phosphorescent particles to cause the particles to glow. Such devices may be used for a wide variety of uses such as advertising, lighted keyboards and other such displays, accent lighting in automobiles, backlighting for liquid crystals displays, night-lights, etc.

Such devices typically include a protective layer that is used to keep water vapor from entering the polymeric material. For example, U.S. Pat. No. 6,207,077 discloses a luminescent thermosetting polyester blend that is water resistant; and U.S. Pat. No. 6,198,216 discloses a polymeric matrix that includes luminescent particles and a fluoride resin binder as well as a protective layer. Because the dielectric properties and chemical properties of such luminescent materials typically rely on the exclusion of water vapor, devices incorporating such luminescent materials typically include a moisture barrier. Such moisture barriers may be relatively expensive for certain devices, and may limit the uses of such devices.

There is a need therefore, for an electroluminescent material whose performance is not dependent on the presence or absence of water vapor from the material.

SUMMARY OF THE INVENTION

A water vapor permeable composite is disclosed for use in electroluminescent devices. The composite includes polymeric material having a first surface energy, a phosphorescent material dispersed within at least a portion of said polymeric material; and an electrically conductive material on at least one side of said polymeric material. The conductive material has a second surface energy, and the first and second surface energies are each between about 32 dynes/cm and about 46 dynes/cm. The polymeric material has a moisture vapor transmission rate of at least one gram/100 sq. inches for a 24 hour period at 100° F. for a one mil thick barrier. Due to the relative matching of surface energies, water vapor does not substantially condense at the interfaces between the conductive material and the polymeric material. Water vapor, therefore, may pass through the composite without adversely affecting the operation of an electroluminescent device that includes a composite of an embodiment of the invention.

BRIEF DESCRIPTION OF THE DRAWING

The following description may be further understood with reference to the accompanying drawings in which.

The drawings are shown for illustrative purposes and are not to scale.

DETAILED DESCRIPTION OF THE INVENTION

The invention provides for the development of electroluminescent materials that may be inert to conditions of water vapor penetration and condensation. This permits the packaging of electroluminescent composites to not be required to be water vapor impermeable.

Figure 1:
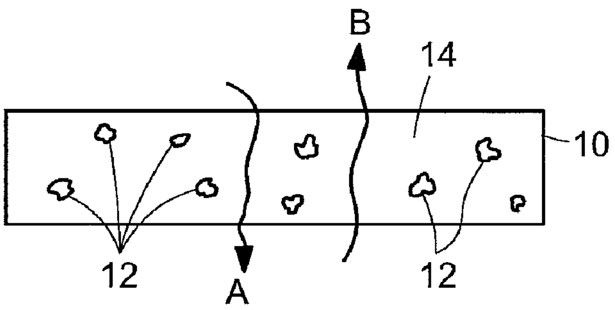
FIG. 1 shows an illustrative diagrammatic view of an electroluminescent composite in accordance with an embodiment of the invention.

In accordance with an embodiment of the invention, an electroluminescent composite 10 may include phosphorescent particles 12 that are dispersed within a polymeric material 14 as shown in FIG. 1. It is preferred that all of the phosphorescent particles be coated by the polymeric material, even near the surface of the composite. The polymeric material permits water vapor to pass through the polymeric material as indicated at A and B. The polymeric and phosphorescent particles are chosen so that the surface energies of each material are each within a range of about 32 to about 46 dynes/cm. Water vapor, therefore, will not condense at the interface between the polymeric material and the phosphorescent particles. Because of this, water vapor will not remain within the composite, and the presence or absence of water vapor therefore, will not substantially affect the performance of the composite when the composite is employed within an electroluminescence device. In various embodiments, the composite 10 may be provided as a product in itself, or may be provided with a carrier (that may or may not be removable) and/or may be provided with one or more adhesive layers on the outer surface of the composite.

Figure 2:
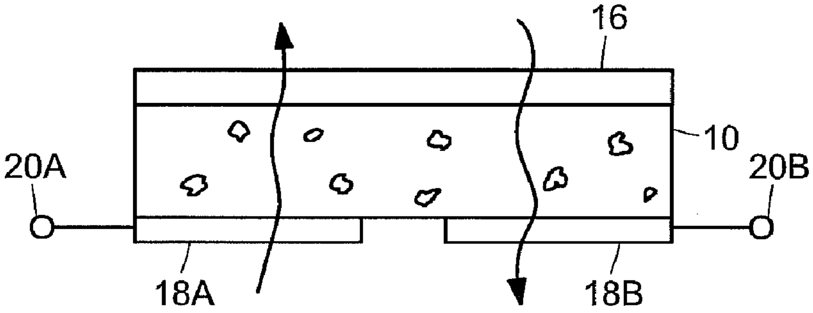
FIG. 2 shows an illustrative diagrammatic view of an electroluminescent composite in accordance with another embodiment of the invention.

In particular, an electroluminescent device using a composite 10 may also include a protective coating 16 and optionally may include a pair of conductors 18A and 18B that are respectively electrically coupled to alternating current sources 20A and 20B as shown in FIG. 2. In other embodiments, the composite 10 and coating 16 may be placed onto conductors or buss bars at a point of application or use of the device. The protective coating 16 and conductors 18A and 18B have a sufficiently high moisture vapor transmission rate that water vapor may pass through these materials as well. In addition, the surface energies of each of protective coating 16 and conductors 18A and 18B are between about 32 to about 46 dynes/cm. Moreover, it is preferred that the difference between the surface energy of the polymeric material and the protective coating remain relatively small, and the difference between the surface energy of the protective coating and the conductors remain relatively small. Water vapor, therefore, will not condense at the interface between the polymeric material and the protective coating, or at the interface between the polymeric material and the conductors. Because of this, water vapor will not remain within the electroluminescent device, and the presence or absence of water vapor therefore, will not substantially affect the performance of the electroluminescence device.

The polymeric material may comprise a pressure sensitive acrylic adhesive film such polyester (PET), polymethylinethacrylate (PMMA), or a thermoplastic coating, polyamides, amorphous polyester resins, acrylic resins, or any other material that provides sufficient moisture vapor transmission and has an appropriate surface energy. It has been discovered that a phosphor to polymer ratios of about 25/75 to about 74/26 may be used in various embodiments. For example, a phosphor to polymer ratio of 55/45 may be used in certain embodiments. Again the properties of the continuous polymer layer should be such that the polymeric material has a low enough specific surface energy that water vapor does not condense at the interface of the phosphors and the polymer, polymer and conductive layer, or polymer and polymer layers, yet the layers may allow water vapor to move freely through the composite. The polymeric material preferably may include untreated polyvinyl chloride, or slip treated polyesters with specific surface energies of less than 46 dynes/cm, with preferred specific surface energies of less than 46 dynes/cm.

For the conductive material, indium tin oxide (InTO) may be used, having a surface energy of about 36 dynes/cm. In other embodiments, lightly metallized conductive layers with a specific surface energy of about 40-42 dynes/cm may be used. It is preferred, however, that the surface energy be between about 32 and about 40.

The following table identifies the surface energies and moisture vapor transmission rates of various materials that may be used in various embodiments of the invention.

TABLE 1

| Material | Specific Surface Energy | MVTR |
|---|---|---|
| Polyester | 41-44 | 2.2 |
| Polyester (amorphous) | 36-38 | 2.6 |
| Polymethylmethacrylate (PMMA) | 41 | 3 |
| Electroluminescent Phosphors | 35-40 | n/a |
| Polycarbonate | 46 | 11 |
| Polystyrene | 38 | 8.5 |
| Rigid PVC | 39 | 3.0 |
| Silicone | 24-28 | 40 |
| Acrylic pressure sensitive adhesives | 32-38 | 15-40 |

Materials having a surface energy below about 32 may have difficultly adhering to other materials in forming an electroluminescent device, although the use of silanes or other adhesion promoters may facilitate overcoming a low surface energy adhesion problem. In fact, the use of such a surface treatment (e.g., with silanes) may cause the specific or critical surface energy of the composite to be reduced. For example a coating of reactive silanes, such as a 3/1-ratio gamma glycidyoxypropyl trimethoxy silane to a propyl amino silane, in a concentration of 0.1-5.0% on weight in a dry (water free) solvent on the surface of a higher specific surface energy material such as Aluminum may reduce the surface energy to a non-condensing level (down to the low to mid 30s dynes/cm). It should be noted that such specific surface energy reductions, which prevent a condensation to water, may also be of value in preventing electrolytic corrosion of metals as the galvanic effect needs water to function. Further, the inclusion of a high moisture barrier as part of the dielectric matrix may have an adverse effect on the performance of an electroluminescent device of the invention. Such barriers may lead to an out-gassing effect (e.g., bubbles forming in the adhesive layer for example). Such "bubbles" once formed, change the "K" (dielectric constant) and change the separation between conductive layers, thus having an adverse effect on the total capacitance and thus the performance of the electro-luminescent device.

It is preferred that an electroluminescent device of the invention have no layer with an MVTR of less than 1 gram mil/100 sq. inches/24 hrs. (Lyssy test at 38° C. and 90% relative humidity), and that no two successive polymer layers differ by more than 6 gram mil/100 sq. inches/24 hrs, and more preferably not differing by more than 3-gram mil/100 sq. inches/24 hrs. Further, the polymeric material should not have its dielectric value substantially changed by the presence of water vapor, particularly if the polymeric material has a relatively low surface energy level. For example a rubber-based adhesive may show a reduction in dielectric constant of about 50% after 3 days at 100° F. and 95% relative humidity. The increase in dielectric constant may result in a dielectric breakdown within the structure effectively shorting out of the device.

Devices of the invention may be coated or printed as desired in various applications in which the device will be coupled to a power supply. Again, there is no need to exclude water from the device, and in fact, it is preferred that water vapor be permitted to freely pass through each of the layers of the device. The devices may be tested for water sensitivity by placing the devices in a high humidity environment (100° F. and about 100% relative humidity). The devices should then be periodically analyzed for illumination stability.

Figure 3:
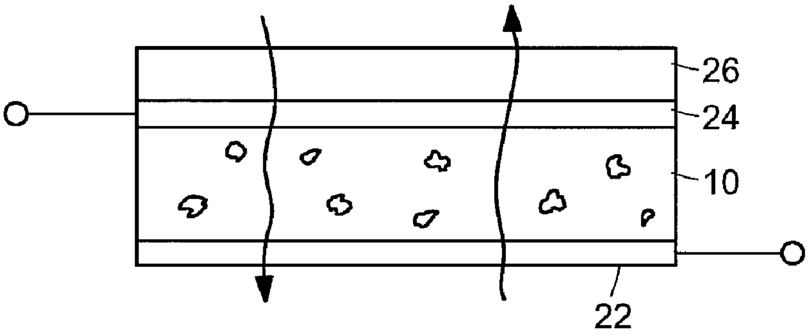
FIG. 3 shows an illustrative diagrammatic view of an electroluminescent composite in accordance with a further embodiment of the invention.

As shown in FIG. 3, an electroluminescent device in accordance with another embodiment of the invention includes a pair of conductive layers 22 and 24 on either side of the composite 10, as well as a protective layer 26. The conductive layer 24 is preferably a transparent conductive layer such as InTO or a lightly metallized aluminum on the order of an optical density of between about 0.07-about 1.0 and preferably between about 0.15 and about 0.30. In other embodiments, the transparent conductor layer may include conductive polymers or carbon nanotubes. The transparent conductive layer should include a sufficient concentration of conductive material such that the conductive layers' product of their resistance and capacitance (RC time constant) defines the frequency of the resistance capacitance layer, and this frequency should be higher than the frequency needed to illuminate the device. As the resistance of the electrically conductive material decreases, the capacitive impedance also decreases as does the total current that is needed to light the phosphors.

Similar to the previous embodiment, the protective layer 26 and conductive layers 22 and 24 have a sufficiently high moisture vapor transmission rate that water vapor may pass through these materials. In addition, the surface energies of each of protective coating 26 and conductive layers 22 and 24 are between about 32 to about 46 dynes/cm. Moreover, it is preferred that the difference between the surface energies of each pair of adjoining layer remain relatively small, preferably less than 6 dynes/cm. Water vapor, therefore, should not condense at any of the interfaces within the device, so water vapor will not remain within the electroluminescent device.

Figure 4:
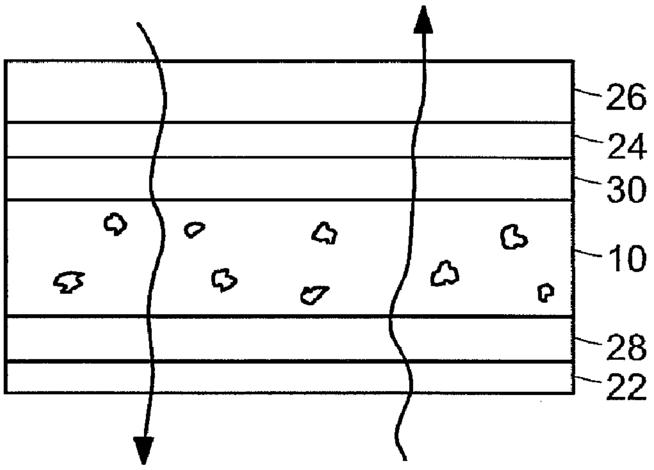
FIG. 4 shows an illustrative diagrammatic view of an electroluminescent composite in accordance with a further embodiment of the invention.

In further embodiments, the device may also include one or two additional dielectric layers 28 and 30 (e.g., between about 0.02-about 0.5 mil) between the composite and either or both of the conductive layers to ensure that the phosphorescent particles do not contact directly a conductive layer as shown in FIG. 4. The protective film 26 may further serve to protect persons from directly contacting any conductor or underlying buss bar or other alternating current source, and may also provide additional structural integrity to the device. Further, a clear protective film may be used to keep dust and scratches out and to lend further structural support for the electroluminescent device. Such films may include polyester, polyolefins, PVC, PVF, polycarbonate, etc. as long as the conditions for adhesion, surface energy and moisture vapor transmission rate are met.

Figure 5:
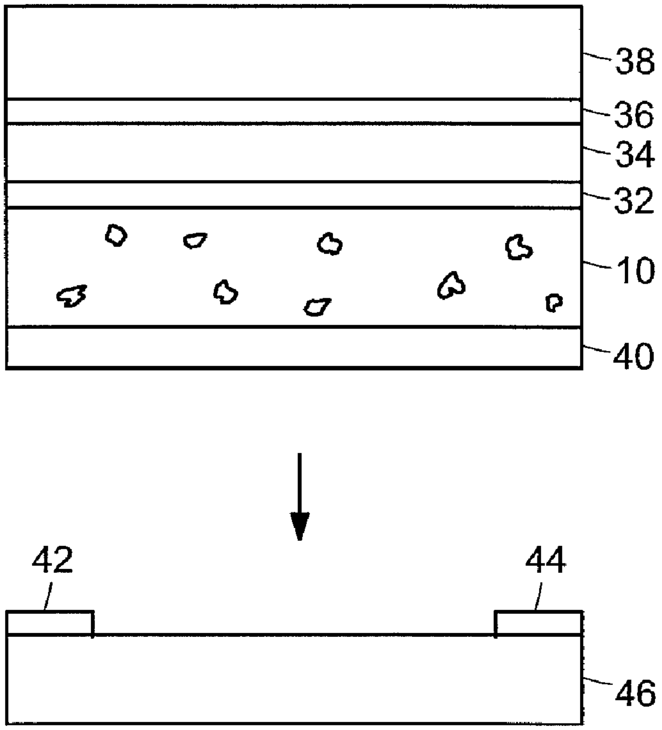
FIG. 5 shows an illustrative diagrammatic view of a transferable electroluminescent composite in accordance with a further embodiment of the invention.
Figure 6:
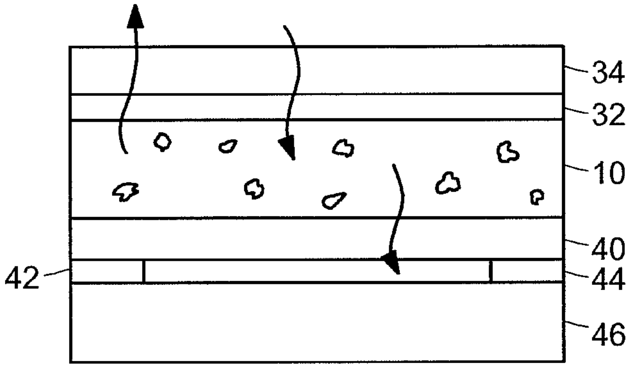
FIG. 6 shows an illustrative diagrammatic view of an electroluminescent composite formed from the transferable electro-luminescent composite shown in FIG. 5.
Figure 7:
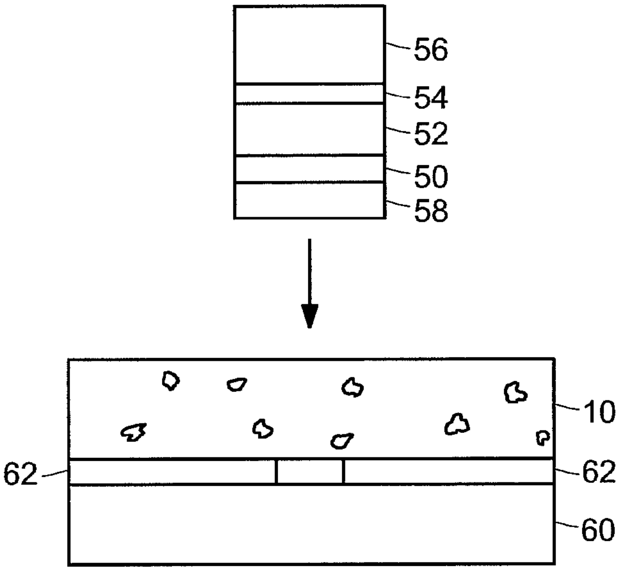
FIG. 7 shows an illustrative diagrammatic view of a transferable conductive composite in accordance with a further embodiment of the invention.
Figure 8:
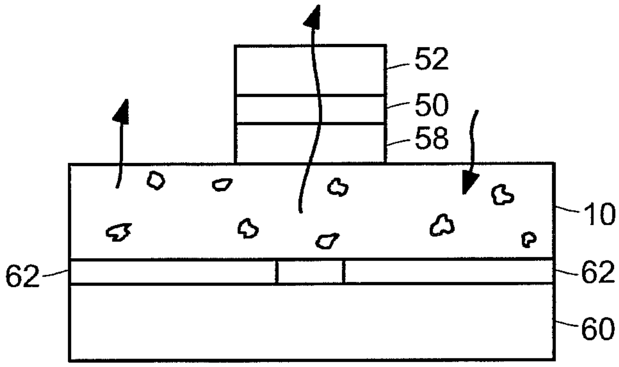
FIG. 8 shows an illustrative diagrammatic view of an electroluminescent composite formed from the transferable conductive composite shown in FIG. 7.

In accordance with yet another embodiment of the invention, a transfer component may be constructed such that thermal transfer printers, or a hot stamping machine may be used to place an electroluminescent composite on a graphic display (e.g., keys on a key board, instrument panel display, etc.). In particular, a transfer component may include a composite 10, a transparent conductive layer 32, a protective layer 34, a release layer 36 and a carrier layer 38, as well as an adhesive layer 40 on the opposite side of the composite 10 as shown in FIG. 5. The transfer component may be applied to one or more conductors 42 and 44 on a graphic display 46 followed by removal of the carrier and release layers 36 and 38 as shown in FIG. 6. In this process, the carrier layer 36 may serve to provide structural support to an otherwise frangible component that becomes transferred to the display 46. In certain embodiments, the polymeric material in composite 10 may include adhesive properties that a separate adhesive 40 is not required. Similarly, in certain embodiments, the conductive layer 32 may include sufficient protective properties that a separate protective coating 34 is not required. Further, the conductive layer may include a coating of a dielectric to ensure that no phosphorescent particles contact the conductive layer. The release layer or break coat layer may remain with the composite following transfer in certain embodiments and may itself serve as a protective layer in the final device.

The "break coat" can, and sometimes does, also act as the "Protective Coating".

In still further embodiments, the transfer component may include a conductive layer 50 and a protective layer 52 in addition to the release layer 54, the carrier layer 56, and the adhesive layer, 58, but not a luminescent composite 10. In this case, the receiving substrate 60 including one or more conductors 62 (such as a display) would already include a luminescent composite 10. This process of transferring a conductive layer to a luminescent composite may permit discrete transfer of various desired indicia or other graphics that need not be coupled to directly to an alternating current power supply since their role is to bridge an existing gap in the receiving substrate. In certain embodiments, the composite 10 may provide sufficient adhesive, for example by including (of about 1% to about 45% and preferably about 2%-about 6%) of an antistatic agent such as CYASTAT sold by Cytec Industries, Inc. of West Paterson, N.J.

Salt may also be employed as an alternating current receptor material in further embodiments of the invention. For example, employing such a material in the bonding adhesive that affixing the luminescent composite to a conductive substrate, may increase the field strength of the electroluminescent device. Alternating current voltages in the range of about 100 volts-about 2500 volts (and preferably between about 400 volts and about 800 volts) at a frequency of about 60 Hz to about 14000 Hz (and preferably between about 1000 Hz and about 5000 Hz) has been found to be effective in devices of the invention. The electrical potential and frequency may be varied for different applications based on, for example, the color desired, the size of the electroluminescent device, the total thickness of the electroluminescent material, the brightness, and the internal impendence and capacitance.

Generally, the higher the frequency, the lower the molecular weight of the salt needed to optimize the results. It has been discovered that salts such as these, which can be reasonably uniformly dispersed within a polymeric matrix, may facilitate the transfer an alternating current signal, which may complete the electroluminescent device circuit. The addition of these charge carrying components may be used either by themselves or in combination with other conductive materials such as the previously discussed vacuum deposited light metal (having an optical density of about 0.15-about 0.40), Indium/Tin Oxide (having resistance between about 25 ohms to about 400 ohms) or other such conductive layer that will allow for the passage of the light generated by the EL device. As an alternative to the conductive salts such as CYSTAT discussed above, other salt like conductive polymers may also be employed. While one charged portion of the conductive polymer (e.g., the cationic portion) is of fairly large molecular weight, the other charge center is typically of low molecular weight.

Further techniques for creating graphic electroluminescent displays may involve masking out with a stencil the graphic items, or even cutting out the graphics from an electroluminescent composite. The desired graphics may then be affixed to a conductor. Since such devices are relatively insensitive to water vapor, they may be used in environments that were previously considered too hostile to electroluminescent devices, such as billboards, sides of busses, airport runways, and floors of retail stores.

Further, such devices may be employed on original documents for security purposes. Such devices may be transferred onto the original document. The device may be designed to provide luminescence only when placed under an alternating current source of a specific frequency.

Those skilled in the art will appreciate that numerous modifications and variations may be made to the above disclosed embodiments without departing from the spirit and scope of the invention.

What is claimed is:

1. A water vapor permeable composite for use in electroluminescent devices, said composite comprising:

a polymeric material having a first surface energy;

a phosphorescent material that fluoresces in the presence of an applied electromagnetic field; and an electrically conductive material on at least one side of said polymeric material, said conductive material having a second surface energy, said first and second surface energies each being between about 32 dynes/cm and about 46 dynes/cm and said polymeric material has a moisture vapor transmission rate of at least one gram/100 sq. inches for a 24 hour period at 100° F.;

wherein said composite includes no material that is provided as a moisture barrier having a moisture vapor transmission rate of less than one gram/100 sq. inches for a 24 hour period at 100° F.

2. The composite as claimed in claim 1, wherein said water vapor permeable composite has an overall moisture vapor transmission rate of greater than one gram/100 sq. inches for a 24 hour period at 100° F.

3. The composite as claimed in claim 1, wherein said polymeric material includes at least one of an acylic, amorphous polyesters, a vinyl, and vinyl acetate copolymers.

4. The composite as claimed in claim 1, wherein said composite includes a protective layer.

5. The composite as claimed in claim 4, wherein said protective layer is clear.

6. The composite as claimed in claim 4, wherein said protective layer has a moisture vapor transmission rate of at least one gram/100 sq. inches for a 24 hour period at 100° F.

7. The composite as claimed in claim 1, wherein said composite further includes a release layer and a carrier layer such that the carrier layer may be removed from the polymeric material and the conductive material following application of the composite to a receiving surface.

8. The composite as claimed in claim 1, wherein said polymeric material includes a polymeric matrix within which said phosphorescent material is dispersed as well as a polymeric film.

9. The composite as claimed in claim 1, wherein said composite further includes a bonding adhesive on a surface of said conductive material for adhering the composite to a conductive surface.

10. The composite as claimed in claim 9, wherein said bonding adhesive is a salt.

11. A water vapor permeable composite for use in electroluminescent devices, said composite comprising:

a polymeric material having a first surface energy;

phosphorescent material in particulate form that fluoresces in the presence of an applied electromagnetic field; and a protective layer having a second surface energy, said first and second surface energies each being between about 32 dynes/cm and about 46 dynes/cm and each of said polymeric material and said protective layer having a moisture vapor transmission rate of at least one gram/100 sq. inches for a 24 hour period at 100° F.;

wherein said composite includes no material that is provided as a moisture barrier having a moisture vapor transmission rate of less than one gram/100 sq. inches for a 24 hour period; and wherein a difference between the moisture vapor transmission rate of the polymeric material and the moisture vapor transmission rate of the protective layer is less than 6 gram mil/100 sq inches for a 24 hour period at 100° F.

12. The composite as claimed in claim 11, wherein said protective layer includes a coating of an electrically conductive material on one side thereof.

13. The composite as claimed in claim 11, wherein said water vapor permeable composite includes a plurality of surface interfaces between layers of said water vapor permeable composite, and each of said surface interfaces is characterized as having a difference between the moisture vapor transmission rates of each adjacent layer of said interface of less than about six grams/100 sq. inches for a 24 hour period at 100° F.

14. The composite as claimed in claim 11, wherein said polymeric material includes a polymeric matrix within which said phosphorescent material is dispersed as well as a polymeric film.

15. A water vapor permeable composite for use in electric devices, said composite comprising:

a polymeric material;

a first electrically conductive layer on at least one side of said polymeric dielectric material; and a protective layer, wherein each of said polymeric material, said first electrically conductive layer, and said protective layer have a moisture vapor transmission rate of at least one gram/100 sq. inches for a 24 hour period at 100° F. such that the operation of said composite is substantially insensitive to the presence of water vapor;

wherein said composite includes no material that is provided as a moisture barrier having a moisture vapor transmission rate of less than one gram/100 sq. inches for a 24 hour period; and wherein a difference between the moisture vapor transmission rate of the polymeric material and the moisture vapor transmission rate of the protective layer is less than 3 gram mil/100 sq. inches for a 24 hour period at 100° F.

16. The composite as claimed in claim 15, wherein said composite further includes a phosphorescent material that is dispersed within said polymeric material.

17. A method of using a water vapor permeable electric device, said method comprising the steps of applying an alternating electric field through a composite of a polymeric material and a conductive material, each of the materials of said composite having a surface energy between about 32 dynes/cm and about 46 dynes/cm, and permitting water vapor to pass through said composite by not blocking the passage of water vapor with a moisture barrier having a moisture vapor transmission rate of less than one gram/100 sq. inches for a 24 hour period at 100° F.

18. The method as claimed in claim 17, wherein said composite further includes a phosphorescent material dispersed within said polymeric material.

19. The method as claimed in claim 17, wherein said composite further includes a protective layer on at least one side of said composite and said step of permitting water vapor to pass through said composite includes permitting water vapor to pass through said protective layer.

* * * * *